(12) United States Patent
Rondeau

(10) Patent No.: US 8,350,576 B2
(45) Date of Patent: Jan. 8, 2013

(54) SWITCHING SYSTEM FOR MULTI-CHANNEL TESTING

(75) Inventor: Brian Matthew Rondeau, West Springfield, MA (US)

(73) Assignee: Exelis Inc., McLean, VA (US)

( * ) Notice: Subject to any disclaimer, the term of this patent is extended or adjusted under 35 U.S.C. 154(b) by 344 days.

(21) Appl. No.: 12/715,479

(22) Filed: Mar. 2, 2010

(65) Prior Publication Data

US 2011/0215655 A1    Sep. 8, 2011

(51) Int. Cl.
*G01R 35/00*     (2006.01)
*B23K 11/24*     (2006.01)

(52) U.S. Cl. .................................. 324/601; 307/112
(58) Field of Classification Search .............. 307/112; 324/75, 750.02, 601

See application file for complete search history.

(56) References Cited

U.S. PATENT DOCUMENTS

| 7,340,365 | B2 | 3/2008 | Wubbena et al. |
| 7,405,575 | B2* | 7/2008 | Tan et al. ...................... 324/638 |
| 2009/0072838 | A1* | 3/2009 | Shepherd et al. ............. 324/537 |

* cited by examiner

*Primary Examiner* — Michael Rutland Wallis
(74) *Attorney, Agent, or Firm* — Cantor Colburn LLP

(57) ABSTRACT

A switching system for interfacing a single channel test equipment with a multi-channel device under test, the switching system including: an input connection for connecting to the single channel test equipment; an N-way switch having an N-way switch input coupled to the input connection, the N-way switch having N switch outputs; N output connections coupled to the N switch outputs, the N output connections for connecting to inputs of the multi-channel device under test; a controller coupled to the N-way switch for controlling a connection between the N-way switch input and one of the N switch outputs.

10 Claims, 1 Drawing Sheet

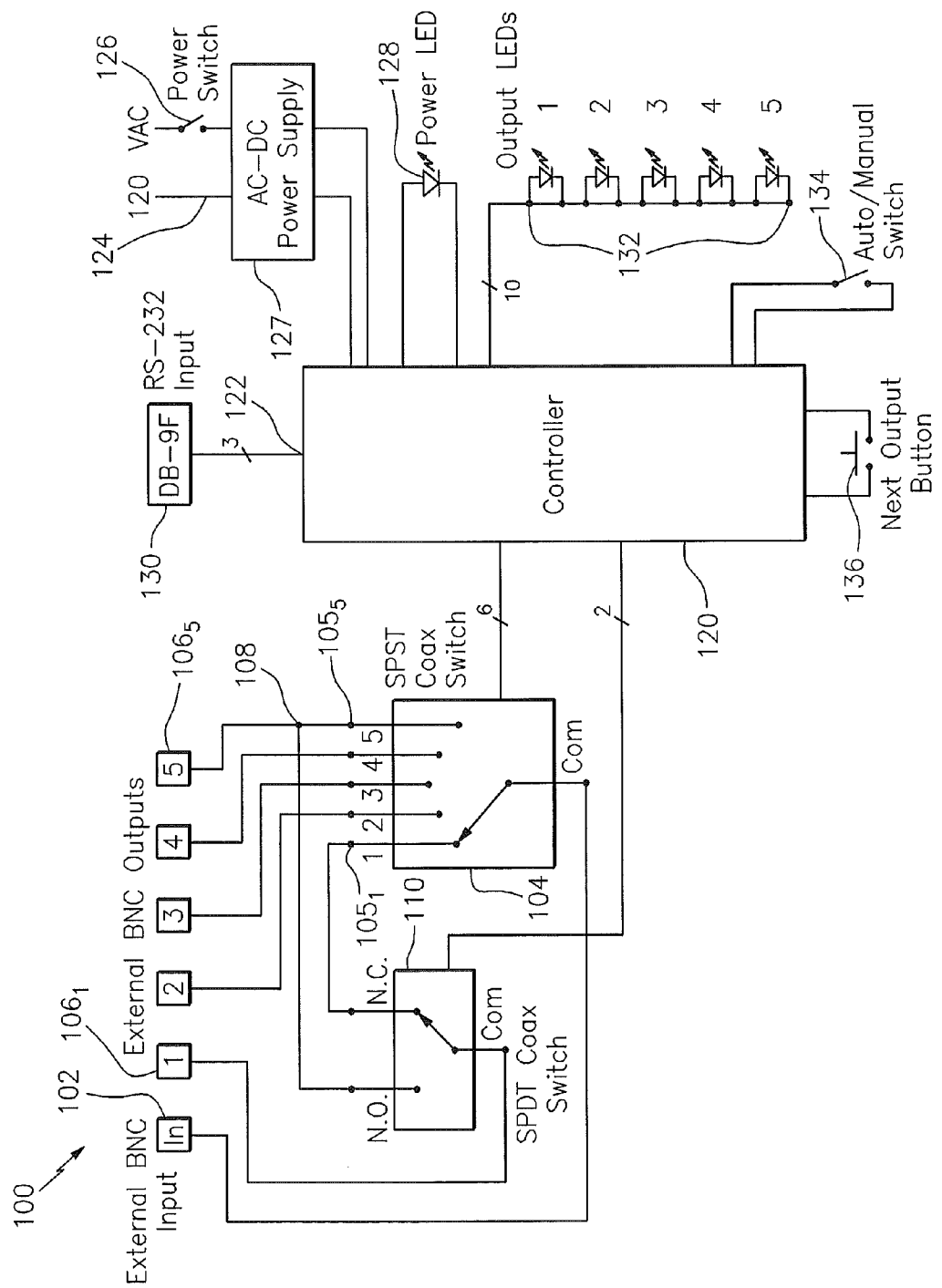

SWITCHING SYSTEM FOR MULTI-CHANNEL TESTING

BACKGROUND OF THE INVENTION

Embodiments of the invention relate generally to test equipment, and in particular to a switching system for facilitating testing of multiple channels on a device.

Certain devices (e.g., oscilloscopes) require periodic testing, such as calibration. There exist in the art single-channel and multi-channel calibration systems. A single-channel oscilloscope calibrator or multi-function calibrator with an oscilloscope output option has only one output, which may be used to calibrate an oscilloscope, one channel at a time. To calibrate the next channel, the operator must physically move the coax cable from one channel to the next, even when using automation software. Using a single-channel oscilloscope calibrator with automation software, the operator is still required to move the coax cable from channel to channel during the calibration testing. Not only does this slow down the process, but it also prevents the operator from accomplishing other duties while the calibration is running. The operator must remain present to move the coax cable when prompted.

A five-channel oscilloscope calibrator has five independent outputs (with five independent signal generators) that are concurrently connected to the five inputs of the oscilloscope (Channel 1-4, Ext Trig). This equipment allows for a fully automated calibration. A five-channel oscilloscope calibrator may offer the convenience of a fully automated calibration, but its purchase cost is considerably higher than the single-channel solutions. In addition, the five-channel calibrator is generally useful for oscilloscope calibration only, leading to a low utilization versus investment cost. This is in contrast to a multi-function calibrator with a single oscilloscope output, which may be used for the calibration of a vast number of other items, such as volt meters, current meters, frequency counters, temperature monitors, etc.

A general RF multiplexer has one input and "x" outputs. This would allow routing one signal to "x" number of outputs, one at a time. A general RF multiplexer cannot properly calibrate the external trigger input of an oscilloscope, as it lacks to ability to route the incoming signal to output number one and five at the same time. Thus, some operator intervention would still be required.

Accordingly, the art would benefit from an improved testing system overcoming the drawbacks of the prior art.

BRIEF SUMMARY OF THE INVENTION

The shortcomings of the prior art are overcome and additional advantages are provided by a switching system for facilitating testing of multiple channels on a device and a method of operation thereof.

An embodiment of the invention is a switching system for interfacing a single channel test equipment with a multi-channel device under test, the switching system including: an input connection for connecting to the single channel test equipment; an N-way switch having an N-way switch input coupled to the input connection, the N-way switch having N switch outputs; N output connections coupled to the N switch outputs, the N output connections for connecting to inputs of the multi-channel device under test; a controller coupled to the N-way switch for controlling a connection between the N-way switch input and one of the N switch outputs.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1 is a schematic diagram of a switching system in an exemplary embodiment.

DETAILED DESCRIPTION

Embodiments of the invention relate to a switching system for routing test signals from test equipment to a device under test. The switching system automatically cycles test cycles across multiple channels on the device.

FIG. 1 is a schematic diagram of a switching system 100 in an exemplary embodiment. The switching system includes an input connection 102 at which an output from test equipment may be connected. Input connection 102 is connected to an N-way switch 104, which has one switch input and N switch outputs $105_1$-$105_5$. The N switch outputs 105 are connected to N output connections 106 which may be plugged into the device to be tested. Output $105_5$ from switch 104 is split at splitter 108 and routed to switch 110. Another terminal of switch 110 is connected to switch output $105_1$. This allows the signal sent to output connection $106_1$ to be either the signal at switch output $105_1$ or the signal at switch output $105_5$. This configuration allows for certain testing modes as described in further detail herein.

N-way switch 104 and switch 110 receive control signals from a controller 120. The controller 120 interfaces with an external control system via a control input 122. Commands from automation software in the external control system come in via an external RS-232 port using a simple proprietary protocol. Exemplary commands include: Set Output Channel, Read Output Channel, Read AUTO/MANUAL Switch State, and Read Microcontroller Firmware Version. The controller 120 ignores invalid commands, which prevents the system from crashing in situations such as having noise on the RS-232 line or improper connection by the operator.

The switching system 100 may be contained within a metal enclosure for shielding purposes. On the outside of this enclosure may be found a 120V input power jack 124, a power switch 126, a power LED 128, a DB-9F connector 130 for RS-232 communications, a BNC input connection 102, five BNC output connections $106_1$-$106_5$, five LEDs 132 corresponding to the five switched BNC outputs 105, an AUTO/MANUAL switch 134, and a pushbutton 136 to choose an output while in MANUAL mode.

The 120V input 124 is routed through the power switch 126 to an AC-DC power supply 127. The AC-DC power supply 127 feeds power to the controller 120. The controller 120 contains voltage regulators and filter capacitors as required by various components on the controller 120. In an exemplary embodiment, there are three integrated circuits in the controller 120: an RS-232 to TTL level converter, a microcontroller, and an eight-channel Darlington array. Two resistor networks are used, one as pullup resistors for the controller inputs, and the other as current limiting resistors for the six LEDs 132 and 128. Internal connections in the controller 120 are made through headers and corresponding connectors. This allows easy removal of the controller PCB if required. The controller 120 also contains a header, which connects to a controller programmer, allowing new firmware to be loaded into the system without having to remove the controller 120 from its socket or the controller 120 from the case.

When the AUTO/MANUAL switch 134 is in the AUTO position, automatic control is allowed. Through the darlington array, the controller 120 controls N-way switch 104 and switch 110 to route the single incoming signal from input 102 to one or more output connections 106. When the AUTO/MANUAL switch 134 is in the MANUAL position, the external pushbutton 136 allows the operator to manually cycle through the five outputs in numerical order followed by no output. This mode is primarily intended for testing and debugging purposes.

The internal RF path is described as follows. The input signal from the test equipment is connected directly at input connection 102 as the common input of the N-way switch 104. The five switch outputs 105 of the N-way switch 104 are directly connected to the five output connections 106, with the exception of switch outputs $105_1$ and $105_5$. Switch output $105_1$ of the N-way switch is connected to the normally closed position of switch 110. Switch output $105_5$ of the N-way switch is connected to a two-way splitter 108. One output of splitter 108 is connected to output connection $106_5$. The other output of splitter 108 is connected to the normally open position of switch 110. Finally, the common connection of switch 110 is connected to output connection $106_1$.

This arrangement of switch outputs $105_1$ and $105_5$ is used because output connection $106_1$ has two roles. Its first role is to calibrate channel one of the device under test (e.g., an oscilloscope). In this scenario, the controller 120 commands the N-way switch 104 to select position $105_1$ and switch 110 to select the normally closed position. This allows the input signal at input connection 102 to be routed to external BNC output connection $106_1$ without incurring significant attenuation at higher frequencies, as would otherwise occur if the signal were split.

The second role of output connection $106_1$ is to aid in the calibration of the external trigger input (through output $106_5$) of the oscilloscope. Calibrating the external trigger requires a signal present on both the output connection $106_1$ and $106_5$. In this scenario, the controller 120 commands the N-way switch 104 to select switch output $105_5$ and switch 110 to select the normally open position. This allows the input signal to be routed to output connection $106_5$ as well as, via the splitter 108 and the switch 110, output connection $106_1$. For output connections $106_2$ through $106_4$, the controller 120 commands the N-way switch 104 to select the corresponding switch output $105_2$-$105_4$ and leaves switch 110 in the normally closed position.

In the example of testing an oscilloscope, a test signal is applied to input 102. Controller 120, under commands received at control input 122, applies the input signal sequentially to outputs $106_1$-$106_4$, testing each of the four channels on the oscilloscope. To test the external trigger input on channel 5 of the oscilloscope, N-way switch 104 is set to position $105_5$ and switch 110 is set to the normally open position, applying the input test signal to both output connections $106_1$ and $106_5$. This tests the external trigger input on output connection $106_5$, which requires an input signal on output connection $106_1$. It is understood that the description of five outputs is exemplary and any number of outputs may be used.

Embodiments of the invention allow a single-channel calibrator to calibrate multi-channel devices with automation software without having to manually move a cable between inputs as each channel is calibrated. The examples above relate to calibrating multi-channel oscilloscopes, however the switching system may also be used for calibrating or testing devices requiring multiple channels of low current DC or low-to-mid frequency RF inputs. Such multi-channel devices may include oscilloscopes, frequency counters, network/spectrum analyzers, RF power meters, multimeters and data acquisition systems.

The switching system overcomes the problems with using a single-channel calibrator by removing the requirement for an operator to move the coax cable from channel to channel. The single-channel calibrator output is connected to input 102 and the outputs are connected to the five oscilloscope inputs. The automation software commands the automatic switch box to route the incoming signal to the appropriate output as required by the specific calibration routine. While the calibration routine is running, the operator is free to perform other duties.

While the invention has been described with reference to exemplary embodiments, it will be understood by those skilled in the art that various changes may be made and equivalents may be substituted for elements thereof without departing from the essential scope thereof. Therefore, it is intended that the invention not be limited to the particular embodiments disclosed for carrying out the invention, but that the invention will include all embodiments falling within the scope of the appended claims.

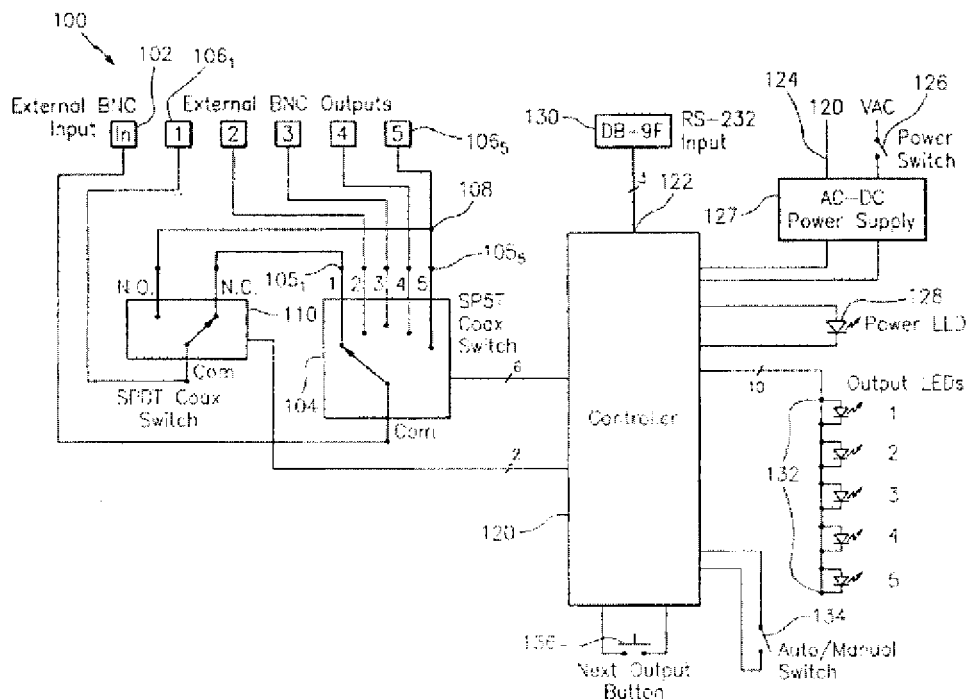

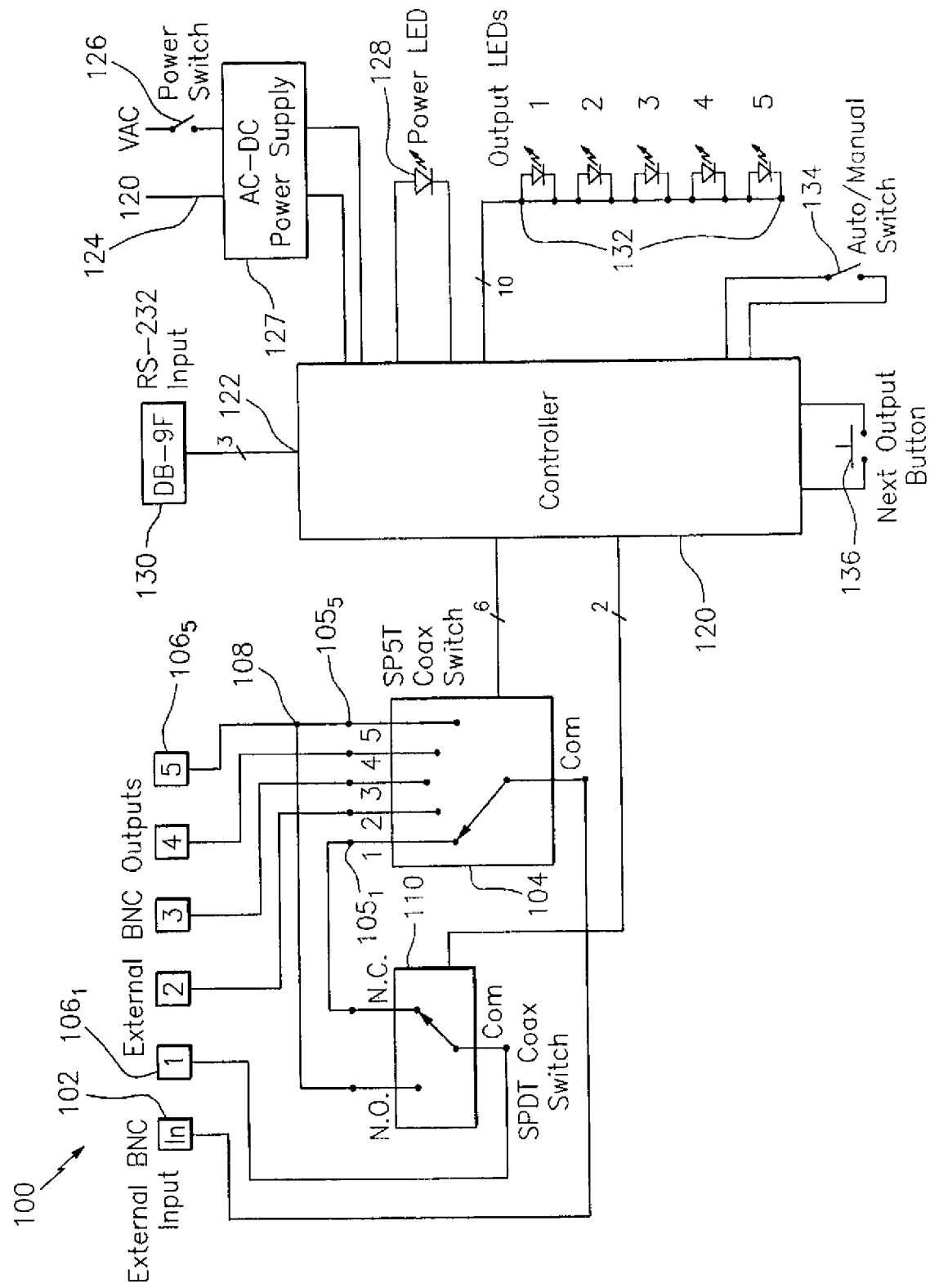

What is claimed is:

1. A switching system for interfacing a single channel test equipment with a multi-channel device under test, the switching system comprising:
   an input connection for connecting to the single channel test equipment;
   an N-way switch having an N-way switch input coupled to the input connection, the N-way switch having N switch outputs, where N is an integer greater than 1;
   N output connections coupled to the N switch outputs, the N output connections for connecting to inputs of the multi-channel device under test; and
   a controller coupled to the N-way switch for controlling a connection between the N-way switch input and one of the N switch outputs;
   wherein the controller receives control commands to automatically connect the N-way switch input to one of the N switch outputs, the controller including a manual switch disabling the automatically connecting the N-way switch input to one of the N switch outputs.

2. A switching system for interfacing a single channel test equipment with a multi-channel device under test, the switching system comprising:
   an input connection for connecting to the single channel test equipment;
   an N-way switch having an N-way switch input coupled to the input connection, the N-way switch having N switch outputs, where N is an integer greater than 1;
   N output connections coupled to the N switch outputs, the N output connections for connecting to inputs of the multi-channel device under test;
   a controller coupled to the N-way switch for controlling a connection between the N-way switch input and one of the N switch outputs,
   a splitter connected to an Nth switch output; and
   a switch receiving an output from the splitter at a first contact and receiving a first N-way switch output at a second contact, the switch selectively coupling one of the output from the splitter and first N-way switch output to a first output connection of the N output connections.

3. The switching system of claim 2 wherein:
the controller controls the status of the switch to toggle between the first contact and the second contact.

4. The switching system of claim 1 wherein:
the controller includes a control input for receiving control commands from an external control system.

5. The switching system of claim 1 wherein:
the controller includes a button for cycling the N-way switch when the manual switch disables controller response to the control commands from the external control system.

6. A method for interfacing a single channel test equipment with a multi-channel device under test, the method comprising:
coupling an input connection to the single channel test equipment;
coupling an N-way switch having an N-way switch input to the input connection, the N-way switch having N switch outputs, where N is an integer greater than 1;
coupling N output connections for connecting to inputs of the multi-channel device under test, the N output connections coupled to the N switch outputs;
using a controller coupled to the N-way switch to control a connection between the N-way switch input and one of the N-way switch outputs, the controller automatically connecting the N-way switch input to one of the N switch outputs in response to control commands;
using a manual input to disable the automatically connecting the N-way switch input to one of the N switch outputs.

7. A method for interfacing a single channel test equipment with a multi-channel device under test, the method comprising:
coupling an input connection to the single channel test equipment;
coupling an N-way switch having an N-way switch input to the input connection, the N-way switch having N switch outputs, where N is an integer greater than 1;
coupling N output connections for connecting to inputs of the multi-channel device under test, the N output connections coupled to the N switch outputs;
using a controller coupled to the N-way switch to control a connection between the N-way switch input and one of the N-way switch outputs;
coupling a splitter to an Nth switch output; and
receiving at a switch an output from the splitter at a first contact and receiving a first N-way switch output at a second contact and selectively coupling one of the output from the splitter and the first N-way switch output to a first output connection of the N output connections.

8. The method of claim 7 wherein:
the controller controls the status of the switch to toggle between the first contact and the second contact.

9. The method of claim 6 wherein:
the controller includes a control input for receiving control commands from an external control system.

10. The method of claim 6 wherein:
using a button to cycle the N-way switch when the controller response to the control commands from the external control system is disabled.

* * * * *

UNITED STATES PATENT AND TRADEMARK OFFICE
CERTIFICATE OF CORRECTION

PATENT NO. : 8,350,576 B2
APPLICATION NO. : 12/715479
DATED : January 8, 2013
INVENTOR(S) : Rondeau Page 1 of 3

It is certified that error appears in the above-identified patent and that said Letters Patent is hereby corrected as shown below:

Please delete the title page showing the illustrative Figure and substitute the attached title page.

Please delete the drawing sheet 1 of 1 and substitute Sheet 1 of 1 as shown on the attached page.

Signed and Sealed this
Ninth Day of April, 2013

Teresa Stanek Rea
*Acting Director of the United States Patent and Trademark Office*

(12) United States Patent
Rondeau

(10) Patent No.: US 8,350,576 B2
(45) Date of Patent: Jan. 8, 2013

(54) SWITCHING SYSTEM FOR MULTI-CHANNEL TESTING

(75) Inventor: Brian Matthew Rondeau, West Springfield, MA (US)

(73) Assignee: Exelis Inc., McLean, VA (US)

( * ) Notice: Subject to any disclaimer, the term of this patent is extended or adjusted under 35 U.S.C. 154(b) by 344 days.

(21) Appl. No.: 12/715,479

(22) Filed: Mar. 2, 2010

(65) Prior Publication Data
US 2011/0215655 A1 Sep. 8, 2011

(51) Int. Cl.
*G01R 35/00* (2006.01)
*B23K 11/24* (2006.01)
(52) U.S. Cl. .................... 324/601; 307/112
(58) Field of Classification Search .............. 307/112; 324/75, 750.02, 601
See application file for complete search history.

(56) References Cited

U.S. PATENT DOCUMENTS

| | | | |
|---|---|---|---|
| 7,340,365 B2 | 3/2008 | Wubbena et al. | |
| 7,405,575 B2 * | 7/2008 | Tan et al. | 324/638 |
| 2009/0072838 A1 * | 3/2009 | Shepherd et al. | 324/537 |

* cited by examiner

*Primary Examiner* — Michael Rutland Wallis
(74) *Attorney, Agent, or Firm* — Cantor Colburn LLP

(57) ABSTRACT

A switching system for interfacing a single channel test equipment with a multi-channel device under test, the switching system including: an input connection for connecting to the single channel test equipment; an N-way switch having an N-way switch input coupled to the input connection, the N-way switch having N switch outputs; N output connections coupled to the N switch outputs, the N output connections for connecting to inputs of the multi-channel device under test; a controller coupled to the N-way switch for controlling a connection between the N-way switch input and one of the N switch outputs.

10 Claims, 1 Drawing Sheet